United States Patent
Wu et al.

(10) Patent No.: US 6,962,884 B2
(45) Date of Patent: Nov. 8, 2005

(54) MONITORING LOW TEMPERATURE RAPID THERMAL ANNEAL PROCESS USING IMPLANTED WAFERS

(75) Inventors: Jingang Wu, Shanghai (CN); Amy Liu, Shanghai (CN); Tony Wang, Shanghai (CN); Dennis Huang, Shanghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 57 days.

(21) Appl. No.: 10/743,689

(22) Filed: Dec. 19, 2003

(65) Prior Publication Data

US 2005/0124080 A1 Jun. 9, 2005

(30) Foreign Application Priority Data

Dec. 5, 2003 (CN) ........................................ 10109111 A

(51) Int. Cl.⁷ .............................................. H01L 21/26

(52) U.S. Cl. ........................... 438/796; 438/486; 257/75

(58) Field of Search ........................... 257/2, 52, 6–70, 257/75, 17; 438/308, 476, 486, 530, 75–799

(56) References Cited

U.S. PATENT DOCUMENTS 5,770,512 A * 6/1998 Murakoshi et al. ......... 438/520

* cited by examiner

Primary Examiner—David Nelms
Assistant Examiner—Calvin Lee
(74) Attorney, Agent, or Firm—Townsend and Townsend and Crew, LLP

(57) ABSTRACT

A method for processing integrated circuit devices. The method includes providing a monitor wafer, which comprising a silicon material. The method introduces a plurality of particles within a depth of the silicon material. The plurality of particles have a reduced activation energy within the silicon material. The method subjects the monitor wafer including the plurality of particles into a rapid thermal anneal process. The method includes applying the rapid thermal anneal process at a first state including a first temperature. The first temperature is within a range defined as a low temperature range, which is less than 650 Degrees Celsius. The method includes removing the monitor wafer and measuring a sheet resistivity of the monitor wafer. The method also determines the first temperature within a tolerance of less than 2 percent across the monitor wafer. The method operates the rapid thermal process using a plurality of production wafers if the first temperature is within a tolerance of a specification temperature.

20 Claims, 5 Drawing Sheets

Figure 7: Changes of Rs as a function of implant dosage of silicon, Boron dosage unchanged(3.5E15).

Figure 8: The dependence of Rs on annealing temperature. The implant dose of silicon varied from 3.0E13 to 5.0E14, Boron dosage unchanged(3.5E15).

MONITORING LOW TEMPERATURE RAPID THERMAL ANNEAL PROCESS USING IMPLANTED WAFERS

CROSS-REFERENCES TO RELATED APPLICATIONS

Not Applicable

STATEMENT AS TO RIGHTS TO INVENTIONS MADE UNDER FEDERALLY SPONSORED RESEARCH OR DEVELOPMENT

Not Applicable

REFERENCE TO A "SEQUENCE LISTING," A TABLE, OR A COMPUTER PROGRAM LISTING APPENDIX SUBMITTED ON A COMPACT DISK

Not Applicable

BACKGROUND OF THE INVENTION

The present invention is directed integrated circuits and their processing for the manufacture of semiconductor devices. More particularly, the invention provides a method for monitoring a rapid thermal annealing process at low temperatures for the manufacture of integrated circuits. But it would be recognized that the invention has a much broader range of applicability. For example, the invention can be applied to a variety of devices such as dynamic random access memory devices, static random access memory devices (SRAM), application specific integrated circuit devices (ASIC), microprocessors and microcontrollers, Flash memory devices, and others.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed.

An example of such a limit is the ability to accurately monitor temperatures in an efficient manner for thermal processes. Such thermal process includes rapid thermal anneal, commonly called RTP. RTP has been useful in the manufacture of highly integrated circuits. Many limitations exist with RTP. For example, temperatures are difficult to control using conventional RTP. Temperature variations exist with RTP and should be monitored daily. Daily monitoring techniques are often difficult to carry out. Additionally, such techniques often cannot monitor temperature variations within very small tolerances, which are often desirable for conventional integrated circuit devices. These and other limitations are described throughout the present specification and more particularly below.

From the above, it is seen that an improved technique for processing semiconductor devices is desired.

BRIEF SUMMARY OF THE INVENTION

According to the present invention, techniques for processing for the manufacture of semiconductor devices are provided. But it would be recognized that the invention has a much broader range of applicability. More particularly, the invention provides a method for monitoring a rapid thermal anneal process at low temperatures for the manufacture of integrated circuits. For example, the invention can be applied to a variety of devices such as static random access memory devices (SRAM), application specific integrated circuit devices (ASIC), microprocessors and micro controllers, Flash memory devices, and others.

In a specific embodiment, the invention provides a method for processing integrated circuit devices. The method includes providing a monitor wafer, e.g., silicon wafer. The monitor wafer comprises a silicon material having a thickness to a predetermined depth. The method also includes implanting silicon bearing impurities into the silicon material to cause the silicon material to be in an amorphous state within a portion of the thickness of the silicon material. The method also includes implanting boron bearing impurities into the silicon material within at least the portion of thickness in the amorphous state. The boron bearing impurities are free from activation as applied to the silicon material and have a reduced activation energy within the silicon material. The method also subjects the monitor wafer including the silicon bearing impurities and boron bearing impurities into a rapid thermal anneal process, commonly called RTP. The method applies the rapid thermal anneal process at a first state including a first temperature to activate a portion of the boron bearing impurities. The first temperature is within a range defined as a low temperature range. The low temperature range is less than 650 Degrees Celsius. The monitor wafer is removed. The method includes measuring a sheet resistivity of the monitor wafer and determining the first temperature within a tolerance of less than 2 percent across the monitor wafer. The method also operates the rapid thermal process using a plurality of production wafers if the first temperature is within a tolerance of a specification temperature.

In an alternative specific embodiment, the method for processing integrated circuit devices. The method includes providing a monitor wafer, which comprising a silicon material. The method introduces a plurality of particles within a depth of the silicon material. The plurality of particles have a reduced activation energy within the silicon material. The method subjects the monitor wafer including the plurality of particles into a rapid thermal anneal process. The method includes applying the rapid thermal anneal process at a first state including a first temperature. The first temperature is within a range defined as a low temperature range, which is less than 650 Degrees Celsius. The method includes removing the monitor wafer and measuring a sheet resistivity of the monitor wafer. The method also determines the first temperature within a tolerance of less than 2 percent across the monitor wafer. The method operates the rapid thermal process using a plurality of production wafers if the first temperature is within a tolerance of a specification temperature.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention can be applied to a variety of applications such as memory, ASIC, microprocessor, and other devices. Preferably, the invention provides a way to monitor a RTP process to a predetermined temperature tolerance of less than 2 percent across a monitor wafer. The invention also provides wafer-to-wafer temperature repeatability. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

Figure 1:
FIGS. 1 through 6 are simplified cross-sectional view diagrams illustrating a method according to an embodiment of the present invention.

According to the present invention, techniques for processing for the manufacture of semiconductor devices are provided. But it would be recognized that the invention has a much broader range of applicability. More particularly, the invention provides a method for monitoring a rapid thermal anneal process at low temperatures for the manufacture of integrated circuits. For example, the invention can be applied to a variety of devices such as static random access memory devices (SRAM), application specific integrated circuit devices (ASIC), microprocessors and micro controllers, Flash memory devices, and others.

A method for fabricating a monitor substrate for temperature analysis of a rapid thermal anneal process according to an embodiment of the present invention is provided as follows:

1. Provide a monitor wafer, e.g., silicon wafer;

2. Introduce a plurality of particles (e.g., boron and silicon) within a depth of the silicon material to achieve a reduced activation energy within the silicon material;

3. Subject the monitor wafer including the plurality of particles into a rapid thermal anneal process;

4. Apply the rapid thermal anneal process at a first state including a first temperature, which is within a range defined as a low temperature range, e.g., less than 650 Degrees Celsius;

5. Remove the monitor wafer;

6. Measure a sheet resistivity of the monitor wafer;

7. Determine the first temperature within a tolerance of less than 2 percent across the monitor wafer; and 8. Operate the rapid thermal process using a plurality of production wafers if the first temperature is within a tolerance of a specification temperature;

9. Alternatively, recalibrate the rapid thermal process and perform steps 1 through 8;

10. Perform other steps, as desired

The above sequence of steps is used to prepare a monitor wafer, which will be used to determine an accurate temperature of a rapid thermal anneal process. The steps can provide an accuracy and tolerance of less than 2 percent across the monitor wafer. Preferably, the plurality of particles include silicon bearing impurities and boron bearing impurities, but can also include other particles such as Arsenic or phosphorous. Further details of the present method can be found according to the Figures below.

A method for fabricating a monitor substrate for temperature analysis of a rapid thermal anneal process and processing using the rapid thermal anneal process according to an embodiment of the present invention is provided as follows:

1. Provide a monitor wafer, e.g., silicon wafer;

2. Form an amorphous state in the silicon material using an implantation or deposition process;

3. Introduce dopant impurities within the silicon material in the amorphous state;

4. Subject the monitor wafer including the plurality of particles into a rapid thermal anneal process;

5. Apply the rapid thermal anneal process at a first state including a first temperature, which is within a range defined as a low temperature range, e.g., less than 650 Degrees Celsius;

6. Remove the monitor wafer;

7. Measure a sheet resistivity of the monitor wafer;

8. Determine the first temperature within a tolerance of less than 2 percent across the monitor wafer by using a plot of sheet resistivity against temperature for experimental monitor wafers; and 9. Operate the rapid thermal process using a plurality of production wafers if the first temperature is within a tolerance of a specification temperature;

10. Alternatively, recalibrate the rapid thermal process and perform steps 1 through 9;

11. Perform other steps, as desired

The above sequence of steps is used to prepare a monitor wafer, which will be used to determine an accurate temperature of a rapid thermal anneal process. The steps can provide an accuracy and tolerance of less than 2 percent across the monitor wafer. Preferably, the plurality of particles include silicon bearing impurities and boron bearing impurities, but can also include other particles such as arsenic or phosphorous. Further details of the present method can be found according to the Figures below.

FIGS. 1 through 6 are simplified cross-sectional view diagrams illustrating a method 100 according to an embodiment of the present invention. These diagrams are merely an illustration, which should not unduly limit the scope of the claims herein. One of ordinary skill in the art would recognize many other variations, modifications, and alternatives. As shown, the method 100 begins by providing a monitor substrate 101, which can be a silicon wafer or the like. Alternative substrates can include any suitable material such as polysilicon film, and silicon on insulator substrate. Preferably, the monitor wafer is the silicon wafer.

Figure 2:
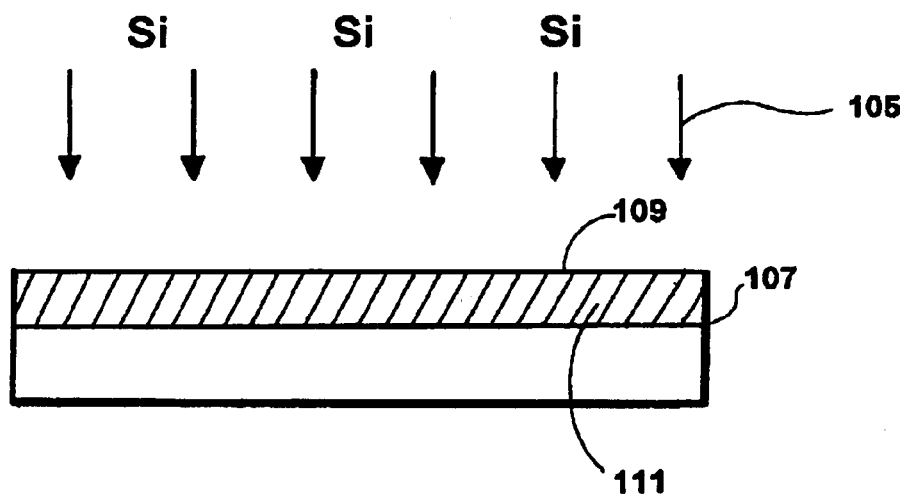
Figure 3:
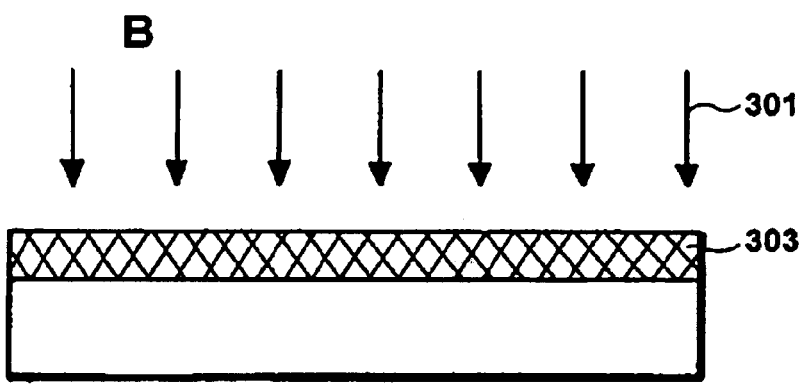

Referring to FIG. 2, the method introduces a plurality of particles 105 to cause an amorphous state within a thickness 111 of the monitor substrate. The thickness is defined to a predetermined depth 107, which can be constant or vary slightly, depending upon the application. The particles are introduced through the surface 109 of the substrate using implantation techniques or others. As shown, the particles can be silicon bearing particles such as elemental silicon. Such silicon can be derived from gases such as silane, dichlorosilane (DCS), any combination of these, and others. Further details of the amorphous state are described throughout the present specification and more particularly below.

The method then introduces particles 301 that decrease a resistivity of the monitor substrate. In a specific embodiment, the particles can be dopant species, such as boron, arsenic, and phosphorous. Alternatively, other suitable materials can be used. Preferably, the particles are boron bearing impurities, which are derived from boron tri-fluoride, $AsH_3$, and $PH_3$. The boron bearing impurities have a reduced activation state within the implanted portion 301 of the monitor substrate. The reduced activation state is used to monitor a temperature of a thermal process, such as a rapid thermal anneal process or others.

Figure 4:
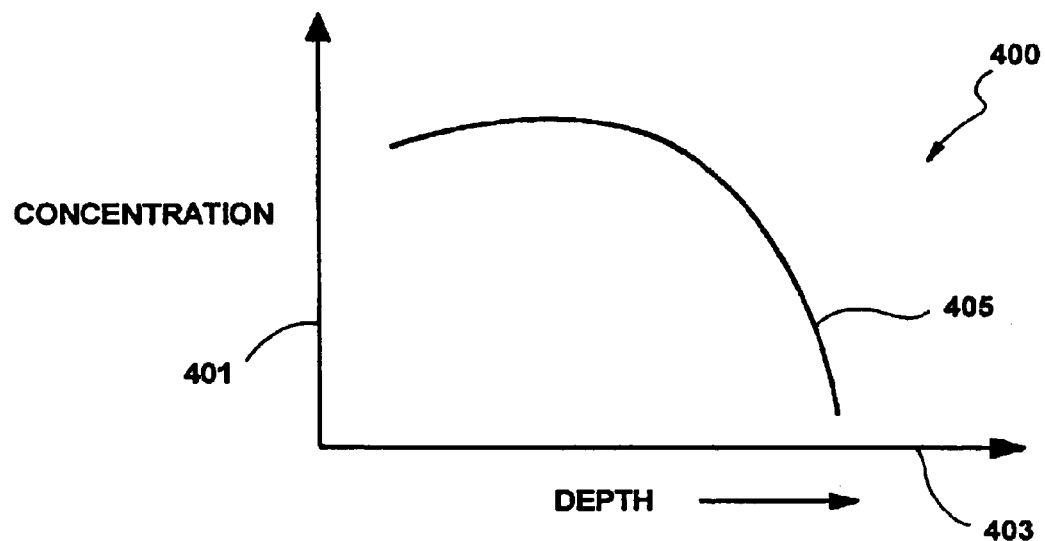

Referring to FIG. 4, the implanted profile 400 as a function of depth is illustrated. This profile is merely an example, which should not unduly limit the scope of the claims herein. One of ordinary skill in the art would recognize many alternatives, variations, and modifications. As shown, the vertical axis 401 illustrates concentration. The horizontal axis 403 illustrates depth from the surface of the monitor substrate to the predetermined depth. The profile 405 is substantially even and then reduces in concentration as a function of depth. Further details of such profile are provided below.

Figure 4A:
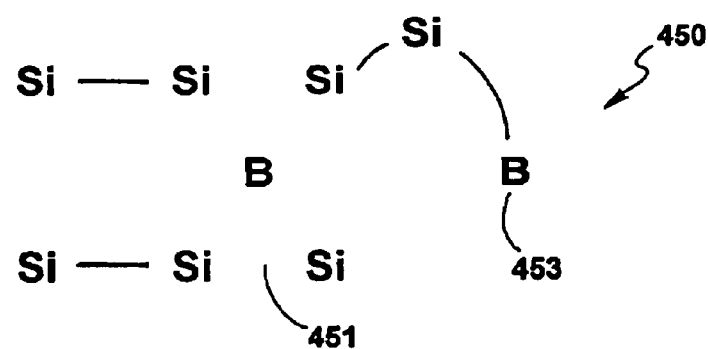
FIG. 4A is a simplified cross-sectional view diagram of a portion of a semiconductor substrate according to an embodiment of the present invention.

FIG. 4A is a simplified cross-sectional view diagram of a portion of a semiconductor substrate according to an embodiment of the present invention. This profile is merely an example, which should not unduly limit the scope of the claims herein. One of ordinary skill in the art would recognize many alternatives, variations, and modifications. The portion 450 of the substrate includes silicon bearing species and boron bearing species. Some of the silicon bearing species is from the original substrate material. Other silicon bearing species have been implanted. Such silicon bearing species have broken bonds 451 and form an amorphous state within the substrate. Boron bearing species 453 are also included. Such boron bearing species have not been activated in part according to a specific embodiment. Accordingly, the monitor substrate including the implanted species can be used to determine temperature of a thermal process, such as rapid thermal anneal.

Figure 5:
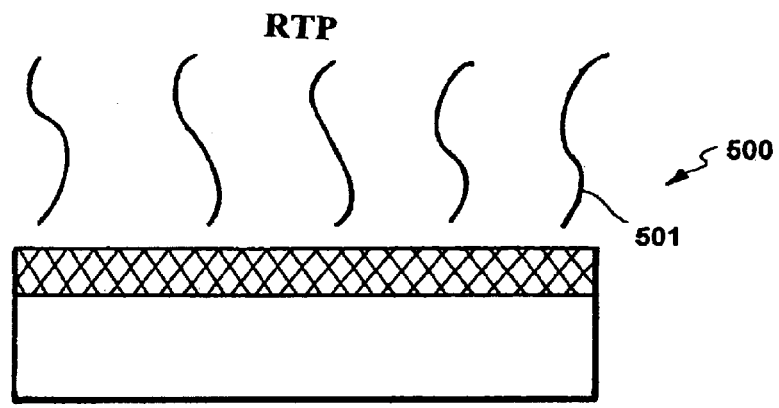
Figure 6:
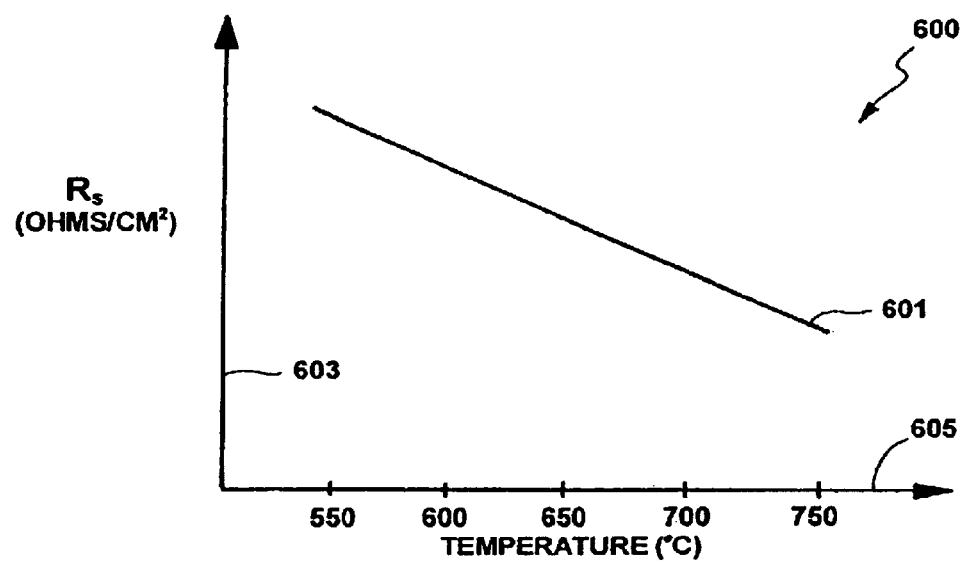

Referring to FIG. 5, rapid thermal anneal 500 of the implanted monitor substrate activates a portion of the boron bearing species. Upon activation, the sheet resistivity of the monitor substrate changes. FIG. 6 illustrates a plot 600 of sheet resistivity against temperature for the monitor substrate. This diagram is merely an example, which should not unduly limit the scope of the claims herein. One of ordinary skill in the art would recognize many alternatives, variations, and modifications. As shown in the vertical axis 603, sheet resistivity is illustrated. The horizontal axis 605 represents temperature, which intersects with the horizontal axis. The plot 601 illustrates that sheet resistivity decreases as a function of temperature. As the monitor substrate is subjected to higher temperatures, additional boron bearing impurities activate, which reduces sheet resistivity. The plot of FIG. 6 can be used to determine temperature based upon the sheet resistivity of the monitor substrate, which has been subjected to the rapid thermal anneal process. The plot can be made using an calibrated rapid thermal anneal tools to determine the temperature of other tools based upon the sheet resistivity of the monitor tool.

Although the above has been illustrated according to a specific embodiment, there can be other modifications, alternatives, and variations. For example, boron has been used as an impurity, but other impurities such as arsenic and phosphorous can also be used. Additionally, a third implant can also be used to form the monitor substrate. Further, additional ways of causing the amorphous state can also be used. It is also understood that the examples and embodiments described herein are for illustrative purposes only and that various modifications or changes in light thereof will be suggested to persons skilled in the art and are to be included within the spirit and purview of this application and scope of the appended claims.

Experiments:

To prove the principle and operation of the present invention, we performed experiments. These experiments are merely examples, which should not unduly limit the scope of the claims herein. One of ordinary skill in the art would recognize many variations, alternatives, and modifications. Further details of such experiments are provided throughout the present specification and more particularly according to the figures below.

As background, RTP tool processes production wafers from 500 Degrees Celsius up to 1100 Degrees Celsius. Oxide growth at 1100 Degrees Celsius and B-implanted wafer annealing at 925 Degrees Celsius are conventionally used to monitor higher temperature of the tool. Metal-deposited wafers (e.g., WSix or Ti/TiN) were conventionally used to monitor low temperature performance of RTP tool. Since both sheet resistivity (Rs) and uniformity depend upon the metal deposition, the monitor data fluctuates too much. For example, about 7% of the uniformity was obtained when WSix wafers were used to monitor low temperature of the tool. In contrast, conventional implanters have a much better control of both Rs value and uniformity.

Silicon implantation is used to form amorphous silicon and to break Si—Si chemical bond in the monitor wafer. Silicon with broken Si—Si bond is in a unsaturated state and can easily react with another dopant such as boron. Dopant activation could happen at a much lower temperature. Thus, the lower temperature activation provides possibility to find a way to monitor low temperature performance of RTP tool by using wafers implanted with both silicon and boron. An N-type wafer (2~5 ohms-cm) was implanted with silicon (30 KeV) and then with Boron(5 KeV/3.5E15) in Quantum Leap of Applied Materials, Inc. The implanted wafer was annealed at different temperatures from 650 Degrees C. to 700 Degrees C. under $N_2$ ambient in Centura XE+ of Applied Materials, Inc. The sheet resistance was measured with KLA-Tencor Rs-75.

Figure 7:
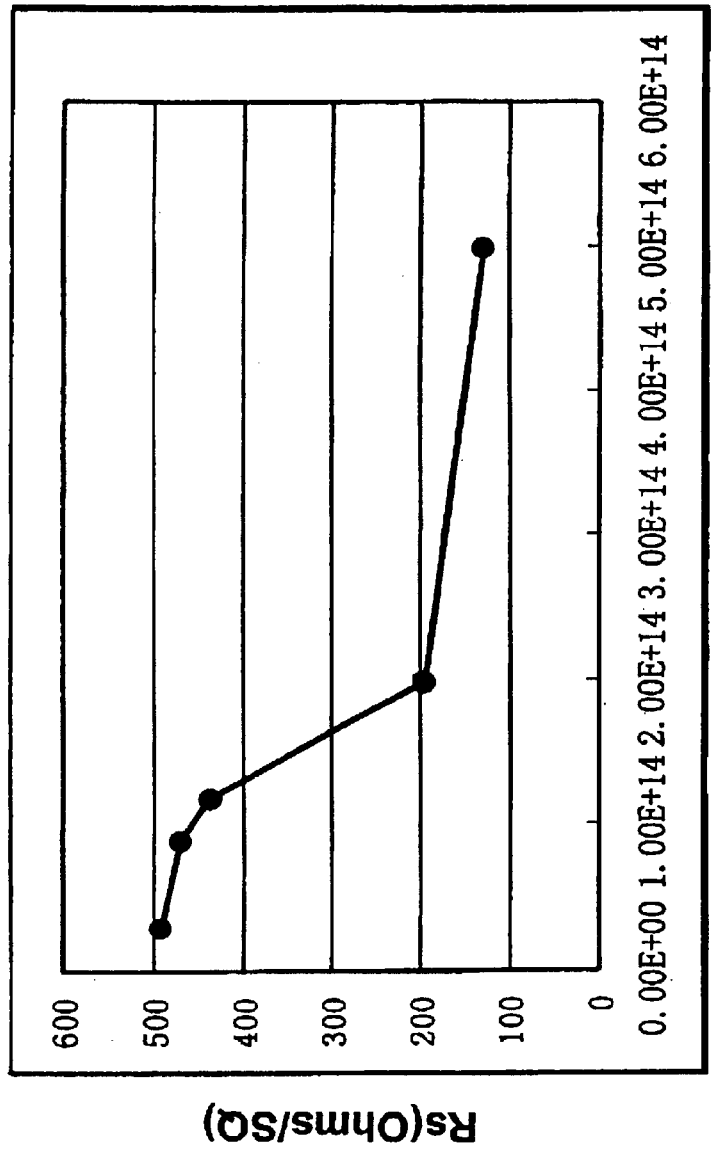
FIGS. 7 through 8 are simplified plots of experimental results according to embodiments of the present invention

FIG. 7 shows Rs changes with the increase of implant dosage of silicon, while boron dosage was kept unchanged, the wafers were annealed at 675° C. With the increase of silicon implant dosage, Rs decreased from 491 ohms/SQ to 129 ohms/SQ, more boron was activated. The results strongly support the idea that pre-amorphous silicon implant can make boron react more easily with silicon and thus decrease the annealing temperature, the activation energy of the reaction between boron and was lowered by the pre-amorphous silicon implantation.

Figure 8:
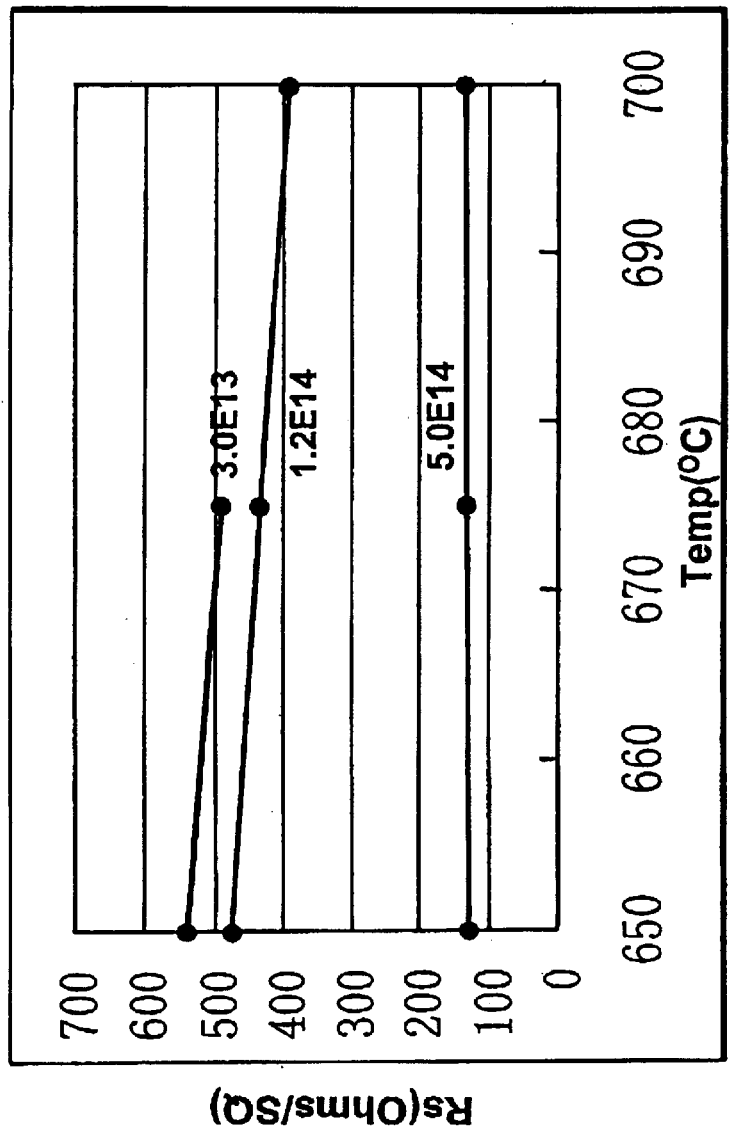

FIG. 8 shows Rs value dependence on annealing temperatures at different silicon dosage. Silicon dosage is a critical parameter. As shown in the Figure, Rs almost remained unchanged when the annealing temperature increased from 650 Degrees C. to 700 Degrees C. at the silicon dosage of 5.0E14 atoms/cm2. The wafer implanted with such a dosage is not suitable to monitor RTP tool. With the decrease of silicon dosage, the sensitivity of Rs to annealing temperature is getting higher. The sensitivity of 1.6 ohms/OC was obtained when pre-amorphous silicon was set to 1.2E14 atoms/cm2, much higher than that obtained from metal-deposited wafers. More importantly, the anneals of the wafers was carried under $N_2$ ambient, no $O_2$ was needed. TiSix or CoSix anneal tool is always equipped with $O_2$ sensors, so any introduction of $O_2$ into the process chambers should not be permitted. Si—Si chemical bond is broken by the silicon implantation and such dopant as Boron could react with silicon more easily, that is helpful to decrease annealing temperatures.

At a suitable pre-amorphous silicon dosage (S030K12E4T07 and B005K35E5T00), a higher sensitivity than metal-deposited wafers was obtained (1.6 ohms/ Degrees C.). Based upon such experiments, we believe both lower temperature annealing and higher sensitivity of Rs-to-temperature provide possibilities to monitor RTP tool at lower temperatures.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for processing integrated circuit devices, the method comprising:

providing a monitor wafer, the monitor wafer comprising a silicon material;

introducing a plurality of particles within a depth of the silicon material, whereupon the plurality of particles have a reduced activation energy within the silicon material;

subjecting the monitor wafer including the plurality of particles into a rapid thermal anneal process;

applying the rapid thermal anneal process at a first state including a first temperature, the first temperature being within a range defined as a low temperature range, the low temperature range being less than 650 Degrees Celsius;

removing the monitor wafer;

measuring a sheet resistivity of the monitor wafer;

determining the first temperature within a tolerance of less than 2 percent across the monitor wafer; and operating the rapid thermal process using a plurality of production wafers if the first temperature is within a tolerance of a specification temperature.

2. The method of claim 1 wherein the introducing of particles comprising:

implanting silicon bearing impurities into the silicon material to cause the silicon material to be in an amorphous state; and implanting boron bearing impurities into the silicon material, whereupon the boron bearing impurities are free from activation as applied to the silicon material.

3. The method of claim 2 wherein the silicon bearing impurities are implanted using a dose of $1 \times 10^{14}$ atoms/$cm^2$.

4. The method of claim 2 wherein the boron bearing impurities are implanted using a dose of $3.5 \times 10^{15}$ atoms/$cm^2$.

5. The method of claim 1 wherein the first temperature is less than 650 Degrees Celsius.

6. The method of claim 1 wherein the first temperature is less than 550 Degrees Celsius.

7. The method of claim 1 wherein the silicon material is in an amorphous state upon deposition.

8. The method of claim 1 wherein the sheet resistivity is provided in a separate tool.

9. The method of claim 1 wherein the operating of the production wafers occurs for 24 hours.

10. The method of claim 1 wherein the monitor wafer is characterized by a temperature sensitivity of at least 1 Ohms per Degree Celsius.

11. A method for processing integrated circuit devices, the method comprising:

providing a monitor wafer, the monitor wafer comprising a silicon material having a thickness to a predetermined depth;

implanting silicon bearing impurities into the silicon material to cause the silicon material to be in an amorphous state within a portion of the thickness of the silicon material;

implanting boron bearing impurities into the silicon material within at least the portion of thickness in the amorphous state, whereupon the boron bearing impurities are free from activation as applied to the silicon material and have a reduced activation energy within the silicon material;

subjecting the monitor wafer including the silicon bearing impurities and boron bearing impurities into a rapid thermal anneal process;

applying the rapid thermal anneal process at a first state including a first temperature to activate a portion of the boron bearing impurities, the first temperature being within a range defined as a low temperature range, the low temperature range being less than 650 Degrees Celsius;

removing the monitor wafer;

measuring a sheet resistivity of the monitor wafer;

determining the first temperature within a tolerance of less than 2 percent across the monitor wafer; and operating the rapid thermal process using a plurality of production wafers if the first temperature is within a tolerance of a specification temperature.

12. The method of claim 11 wherein the activated boron bearing impurities influence the sheet resistivity.

13. The method of claim 11 wherein the monitor wafer comprising the boron bearing impurities and the silicon bearing impurities are characterized by a temperature sensitivity of at least 1 Ohms per Degree Celsius.

14. The method of claim 11 wherein the range being less than 550 Degrees Celsius.

15. The method of claim 11 wherein the silicon bearing impurities are implanted using a dose of $1 \times 10^{14}$ atoms/$cm^2$.

16. The method of claim 11 wherein the boron bearing impurities are implanted using a dose of $3.5 \times 10^{15}$ atoms/$cm^2$.

17. The method of claim 11 wherein the tolerance of the temperature specification is less than 1 percent across the monitor wafer.

18. The method of claim 11 wherein the plurality of production wafers is at least 100 wafers.

19. The method of claim 11 wherein the monitor wafer is a silicon wafer.

20. The method of claim 11 further comprising storing the monitor wafer after the boron implanting and silicon implanting.

* * * * *